(12) United States Patent
Vlasenko et al.

(10) Patent No.: US 8,000,430 B2
(45) Date of Patent: *Aug. 16, 2011

(54) WIDE FREQUENCY RANGE DELAY LOCKED LOOP

(75) Inventors: Peter Vlasenko, Ottawa (CA); Dieter Haerle, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 14 days.

This patent is subject to a terminal disclaimer.

(21) Appl. No.: 11/999,162

(22) Filed: Dec. 4, 2007

(65) Prior Publication Data
US 2008/0089459 A1 Apr. 17, 2008

Related U.S. Application Data

(63) Continuation of application No. 10/335,535, filed on Dec. 31, 2002, now Pat. No. 7,336,752.

(51) Int. Cl.
*H03D 3/24* (2006.01)

(52) U.S. Cl. ........ 375/376; 375/371; 375/373; 375/375; 327/147; 327/148; 327/149; 327/150; 327/151; 327/155; 327/156; 327/157; 327/159; 327/160; 327/161

(58) Field of Classification Search .......... 375/371–376; 327/153–163
See application file for complete search history.

(56) References Cited

U.S. PATENT DOCUMENTS

| | | | |
|---|---|---|---|
| 5,544,203 A | 8/1996 | Casasanta et al. | |
| 5,604,775 A | 2/1997 | Saitoh et al. | |
| 6,087,868 A | 7/2000 | Millar | |
| 6,157,690 A * | 12/2000 | Yoneda | 375/376 |
| 6,242,955 B1 | 6/2001 | Shen et al. | |
| 6,275,079 B1 * | 8/2001 | Park | 327/143 |
| 6,327,318 B1 | 12/2001 | Bhullar et al. | |
| 6,333,896 B1 | 12/2001 | Lee | |
| 6,337,590 B1 * | 1/2002 | Millar | 327/158 |
| 6,346,837 B1 * | 2/2002 | Shibayama | 327/156 |
| 6,356,158 B1 * | 3/2002 | Lesea | 331/11 |
| 6,377,092 B2 | 4/2002 | Ikeda | |
| 6,392,456 B1 | 5/2002 | Pyeon et al. | |
| 6,489,823 B2 | 12/2002 | Iwamoto | |
| 6,518,807 B1 * | 2/2003 | Cho | 327/158 |

(Continued)

FOREIGN PATENT DOCUMENTS

EP 1 282 229 A 2/2003

(Continued)

OTHER PUBLICATIONS

Dehng, G., et al., "A Fast-Lock Mixed-Mode DLL Using a 2-b SAR Algorithm," *IEEE Journal of Solid-State Circuits*, 36(10):1464-1471 (2001).

(Continued)

*Primary Examiner* — Curtis B Odom
(74) *Attorney, Agent, or Firm* — Hamilton, Brook, Smith & Reynolds, P.C.

(57) ABSTRACT

A delay locked loop operates over a wide range of frequencies and has high accuracy, small silicon area usage, low power consumption and a short lock time. The DLL combines an analog domain and a digital domain. The digital domain is responsible for initial lock and operational point stability and is frozen after the lock is reached. The analog domain is responsible for normal operation after lock is reached and provides high accuracy using smaller silicon area and low power.

34 Claims, 10 Drawing Sheets

U.S. PATENT DOCUMENTS

| | | | | |
|---|---|---|---|---|
| 6,765,976 | B1* | 7/2004 | Oh | 375/376 |
| 7,042,971 | B1* | 5/2006 | Flanagan et al. | 375/376 |
| 7,336,752 | B2* | 2/2008 | Vlasenko et al. | 375/376 |
| 2002/0008558 | A1 | 1/2002 | Okuda | |
| 2002/0015460 | A1* | 2/2002 | Bhullar et al. | 375/371 |
| 2002/0097074 | A1 | 7/2002 | Kim et al. | |
| 2002/0167347 | A1* | 11/2002 | Kouzuma | 327/159 |
| 2003/0025539 | A1* | 2/2003 | Fiscus | 327/158 |
| 2003/0067335 | A1* | 4/2003 | von Kaenel | 327/158 |

FOREIGN PATENT DOCUMENTS

| | | |
|---|---|---|
| JP | 09-251057 | 9/1997 |
| KR | 1020000050584 A | 8/2000 |
| KR | 1020010044877 A | 6/2001 |
| KR | 1020020040941 A | 5/2002 |

OTHER PUBLICATIONS

Garlepp, B. W., et al., "A Portable Digital DLL of High-Speed CMOS Interface Circuits," *IEEE Journal of Solid-State Circuits*, 34(5):632-644 (1999).

Jung, Y. et al., "A Dual-Loop Delay-Locked Loop Using Multiple Voltage-Controlled Delay Lines," *IEEE Journal of Solid-State Circuits*, 36(5):784-791 (2001).

Maneatis, J. G., "Low-Jitter Process-Independent DLL and PLL Based on Self-Biased Techniques," *IEEE Journal of Sold-State Circuits*, 31(11): 1723-1732 (1996).

Moon, Y., et al., "An All-Analog Multiphase Delay-Locked Loop Using a Replica Delay Line for Wide-Range Operation and Low-Jitter Performance," *IEEE Journal of Solid-State Circuits*, 35(3): 377-384 (2000).

Sidiropoulos, S. and Horowitz, M. A., "A Semidigital Dual Delay-Locked Loop," *IEEE Journal of Solid-State Circuits*, 32(11): 1683-1692 (1997).

Sidiropoulos, S., et al., "A Semidigital Dual Delay-Locked Loop", *IEE Journal of Solid-State Circuits*, 32(11): 1683-1692, (1997).

Park, et al., "A Semi-Digital Delay Locked Loop for Clock Skew Minimization," *12th International Conference on VLSI Design*, Jan. 1999, pp. 584-588.

Yoon, et al., "A 2.5-V, 333-Mb/s/pin, 1-Gbit, Double-Data-Rate Synchronous DRAM," *IEEE Journal of Solid-State Circuits*, vol. 34, No. 11, Nov. 1999, pp. 1589-1599.

* cited by examiner

| FIG. 4A | FIG. 4B |

WIDE FREQUENCY RANGE DELAY LOCKED LOOP

RELATED APPLICATIONS

This patent application is a Continuation Patent Application of U.S. Ser. No. 10/335,535 filed on Dec. 31, 2002 now U.S. Pat. No. 7,336,752. The entire teachings of the above patent application are incorporated by reference in its entirety.

BACKGROUND OF THE INVENTION

Many devices such as synchronous dynamic random access memory (SDRAM) and microprocessors receive an external clock signal generated by an external clock source such as a crystal oscillator. The external clock signal received through an input pad on the device is routed to various circuits within the device through a tree of buffer circuits. The buffer tree introduces a common delay between the external clock and each buffered clock.

Typically, a delay locked loop (DLL) with an adjustable delay line is used to synchronize the buffered clock signal with the external clock signal by delaying the external clock signal applied to the buffer tree. The DLL includes a phase detector, which detects the phase difference between the external clock signal and a buffered clock signal. Based on the detected phase difference, the DLL synchronizes the buffered clock signal to the external clock signal by adding an appropriate delay to the external clock signal until the buffered external clock signal (the internal clock) is in phase with the external clock signal. The DLL can be implemented as an analog delay locked loop or a digital delay locked loop. In an analog delay locked loop, a voltage controlled delay line is used to delay the external clock signal.

FIG. 1 is a block diagram of a prior art analog delay locked loop (DLL) 100. The analog DLL 100 synchronizes an internal clock signal $CK_1$ with an external clock signal $CK_E$. The external clock $CK_E$ signal is coupled to a voltage controlled delay line 102, and the voltage controlled delay line 102 is coupled to clock tree buffers 108. The delayed external clock signal $CK_E$ is fed into the clock tree buffers 108 where it propagates to the outputs of the tree and is applied to the various circuits. The delay through the clock tree buffer 108 results in a phase difference between the external clock signal $CK_E$ and the internal clock signal $CK_1$. The voltage controlled delay line 102 adds further delay to the external clock signal $CK_E$ to synchronize the external and internal clock signals.

To determine the appropriate delay in the delay line, one of the outputs of the clock tree buffers 108 is coupled to a phase detector 104 where it is compared with the external clock signal $CK_E$. The phase detector 104 detects the phase difference between the internal clock $CK_1$ and the external clock $CK_E$. The output of the phase detector 104 is integrated by a charge pump 106 and a loop filter capacitor 112 to provide a variable bias voltage $V_{CTRL}$ 110 for the voltage controlled delay line (VCDL) 102. The bias voltage $V_{CTRL}$ selects the delay to be added to the external clock signal by the VCDL 102 to synchronize the internal clock signal $CK_1$ with the external clock signal $CK_E$.

The phase detector 104 can be a D-type flip-flop with the D-input coupled to the external clock signal $CK_E$ and the clock input coupled to the internal clock signal $CK_1$. On each rising edge of the internal clock signal $CK_1$, the output of the phase detector 104 indicates whether the rising edge of the internal clock signal is before or after the rising edge of the external clock signal.

The analog DLL 100 produces a voltage controlled delay with high accuracy. However performance of the analog DLL varies over a frequency range because of a non-linear control voltage characteristic.

FIG. 2 is a graph illustrating the non-linear control voltage characteristic for the voltage controlled delay line shown in FIG. 1. In general, devices support a wide range of external clock frequencies within which an operational frequency is selected for a particular device. In the example shown in FIG. 2, the device can operate at any frequency between point A and point C. The operational frequency selected is at point B.

As shown, the control voltage characteristic is non-linear: sharp at one end of the control voltage range (point C) and almost flat at the opposite end (point A). This control voltage characteristic results in DLL instability at point C and long lock times at point A. The wide range of frequencies (delays) is controlled by the bias voltage $V_{CTRL}$.

Referring to FIG. 1, the bias voltage $V_{CTRL}$ is the output of the charge pump 106, which remains in a high-impedance state most of the time. Any noise on the bias voltage signal $V_{CTL}$ disturbs the output of the analog DLL 100. For example, if the analog DLL is operating at point B, a small voltage change (ΔV) due to noise results in a large change in delay. Thus, the analog DLL is very sensitive to noise when operating at point B, within the wide frequency range shown from point C to point A. Therefore, the analog DLL is not stable within a wide frequency range.

A digital DLL does not have the stability problem of an analog DLL. However, the accuracy of a digital DLL is not the same as the accuracy of an analog DLL, because the delay is provided by combining fixed quantum (steps) of delay. The smaller the step of delay, the higher the accuracy. However, a decrease in step size results in a corresponding increase in silicon area because more delay elements are required to cover the wide frequency range.

SUMMARY OF THE INVENTION

A delay locked loop, which has high accuracy, good stability and a fast lock time over a wide frequency range is presented. The delay locked loop combines shorter lock time, good accuracy and stability with low power consumption and small silicon area for the delay locked loop operating in a wide range of frequencies.

The delay locked loop includes a digital delay circuit and an analog delay circuit. The digital delay circuit engages delay elements to provide coarse phase adjustment in the delay locked loop. The analog delay circuit provides a fine phase adjustment in the delay locked loop while the digital delay circuit is held at a fixed delay. A lock detector in the digital delay circuit detects completion of the coarse phase adjustment, freezes the fixed delay upon completion and enables fine phase adjustment.

The digital delay circuit, which includes a plurality of fixed delay elements, operates in a wide delay range. The analog delay circuit operates in a small delay range within the wide delay range and is held at a second fixed delay until the digital delay circuit completes the coarse phase adjustment.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 3:
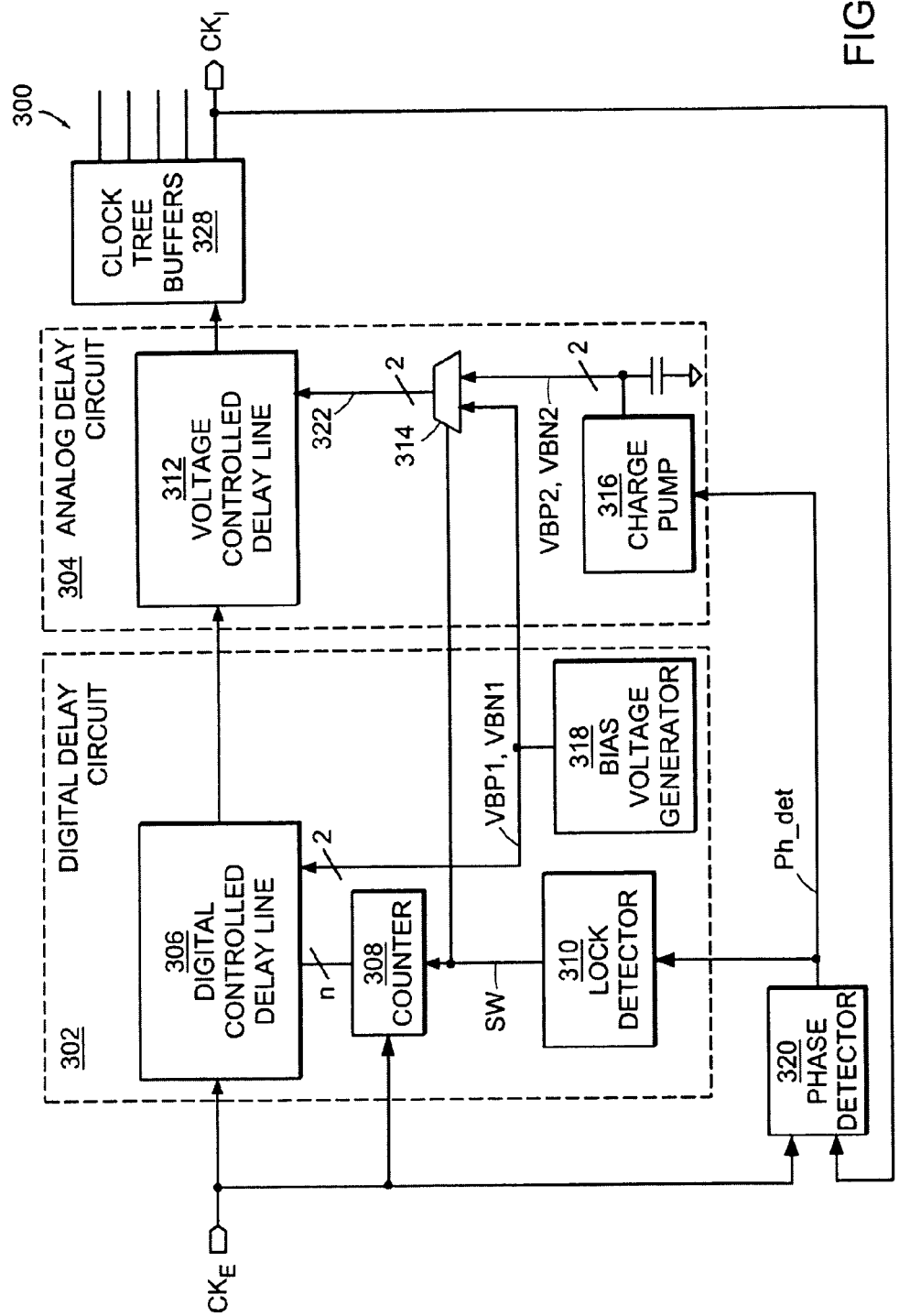
FIG. 3 is a block diagram of a wide frequency range delay locked loop according to the principles of the present invention.

FIG. 3 is a block diagram of a wide frequency range delay locked loop (DLL) 300 according to the principles of the present invention. The wide frequency range DLL 300 has two domains of operation: a digital domain which includes a digital delay circuit 302 and an analog domain which includes an analog delay circuit 304.

In a DLL, high accuracy, small silicon area usage and lower power are typically achieved using an analog technique, while good stability and shorter lock times are typically achieved with a digital technique. The wide frequency range DLL 300 combines the two techniques to provide high accuracy, good stability and a fast lock time over a wide frequency range. The digital delay circuit 302 is responsible for coarse phase adjustment during initialization and the analog delay circuit 304 is responsible for fine phase adjustment during normal operation, after coarse phase adjustment is completed by the digital delay circuit 302. The digital delay circuit 302 operates within the wide delay range and brings the delay locked loop 300 to a stable operation point during power-up initialization. In normal operation, the analog delay circuit 304 operates within a small delay range of the stable operation point within the wide delay range and maintains the delay locked loop at the stable operation point while the digital delay circuit 302 is held at a fixed delay.

The overall delay provided by the DLL includes a digitally controlled delay line (DCDL) 306 having a set of delay elements, each having a fixed delay and a voltage controlled delay line (VCDL) 312. The combination of the DCDL delay provided by the DCDL 306 and the VCDL delay provided by the VCDL 312 provides an accurate delay. Only one of the domains can vary the DLL delay at any time. At power-up initialization, the digital delay circuit 302 varies the DCDL 306 (coarse delay). After coarse phase adjustment is complete (lock is reached), the DCDL delay is held at a fixed number of DCDL delay elements (frozen) and the analog delay circuit 304 varies the DLL delay to provide fine phase adjustment by varying the VCDL delay.

The digital delay circuit 302 operates within the wide delay range to bring the DLL 300 to the operation point (lock) quickly to provide a short lock time. A lock detector 310 in the digital delay circuit 302 detects when the digital delay circuit 302 has brought the DLL delay to the stable operation point and enables control of the DLL delay to be switched to the analog delay circuit 304.

A phase detector 320 detects the phase difference between the external clock signal $CK_E$ and the internal clock signal $CK_1$. The phase detector 320, can be any phase detector well known to those skilled in the art. In the embodiment shown, the phase detector 320 (FIG. 3) includes a D-type flip-flop with $CK_1$ connected to the clock input and $CK_E$ connected to the D-input. The rising edge of $CK_1$ latches the state of $CK_E$ at the output (Ph_det) of the D-type flip-flop.

The analog delay circuit 304 includes a multiplexor 314, a VCDL 312 and a charge pump 316. The VCDL 312 is a chain of differential-input-differential-output stages (delay elements) with voltage control. The multiplexor 314 selects the source of the VCDL bias voltage 322 to the VCDL 312. The VCDL bias voltage 322 is a fixed bias voltage $V_{BP1}$, $V_{BN1}$ provided by bias voltage generator 318 or a variable bias voltage $V_{BP2}$, $V_{BN2}$ provided by charge pump 316. During initialization, before the DCDL 306 achieves lock, differential bias voltage $V_{BP1}$, $V_{BN1}$ provides the VCDL bias voltage 322 through multiplexor 314. Thus, while the digital delay circuit 302 selects the DCDL delay, the VCDL bias voltage 322 provides a constant VCDL delay. That delay may be in the middle of the full delay range of the VCDL to enable fine tuning in both positive and negative directions as discussed below.

At initialization, the code stored in a counter 308 is initialized to zero, which corresponds to the minimum delay; that is, the minimum number of delay cells in the DCDL 306 that are engaged. The lock detector 310 allows the DCDL 306 to increase the DCDL delay by adding delay cells as the counter 318 is incremented until the nearest rising edge of the internal clock signal $CK_1$ is aligned with the external clock signal $CK_E$. The counter 308 is incremented by the external clock signal $CK_E$ until lock is reached (the clocks are aligned). In one embodiment, the counter 308 is an up counter which increments on each rising edge of the external clock signal $CK_E$ while enabled by the SW signal from the lock detector 310. Delay cells in the DCDL 306 are added to the DCDL delay line based on the n-bit count value output by the counter 308 to engage the minimum number of DCDL delay cells necessary dependent on the bias voltage $V_{BP1}$, $V_{BN1}$.

After the clocks are aligned, the SW signal output by the lock detector 310 disables any further incrementing of the counter 308. The VCDL bias voltage 322 is provided by bias voltage $V_{BP2}$, $V_{BN2}$, the output of charge pump 316, through multiplexor 314. The charge pump 316 can be any charge pump well known to those skilled in the art.

By engaging only the minimum number of delay cells in the DCDL 306, the overall delay line is minimum length to minimize noise. Once lock is reached, the digital delay circuit 302 is held at a fixed delay by disabling further incrementing of the counter 308. Only the VCDL portion of the DLL delay line can be varied by the analog delay circuit 304. The analog delay circuit 304 fine tunes the DLL delay to compensate for all drifts and condition changes to keep the external and internal clock signal edges aligned, by varying the VCDL delay, which is added to the fixed delay provided by the DCDL. The analog controlled delay line 310 varies the VCDL delay up or down by varying the bias voltage to the VCDL delay cells 402 based on detected phase difference between the clocks.

Figures 4, 4A:
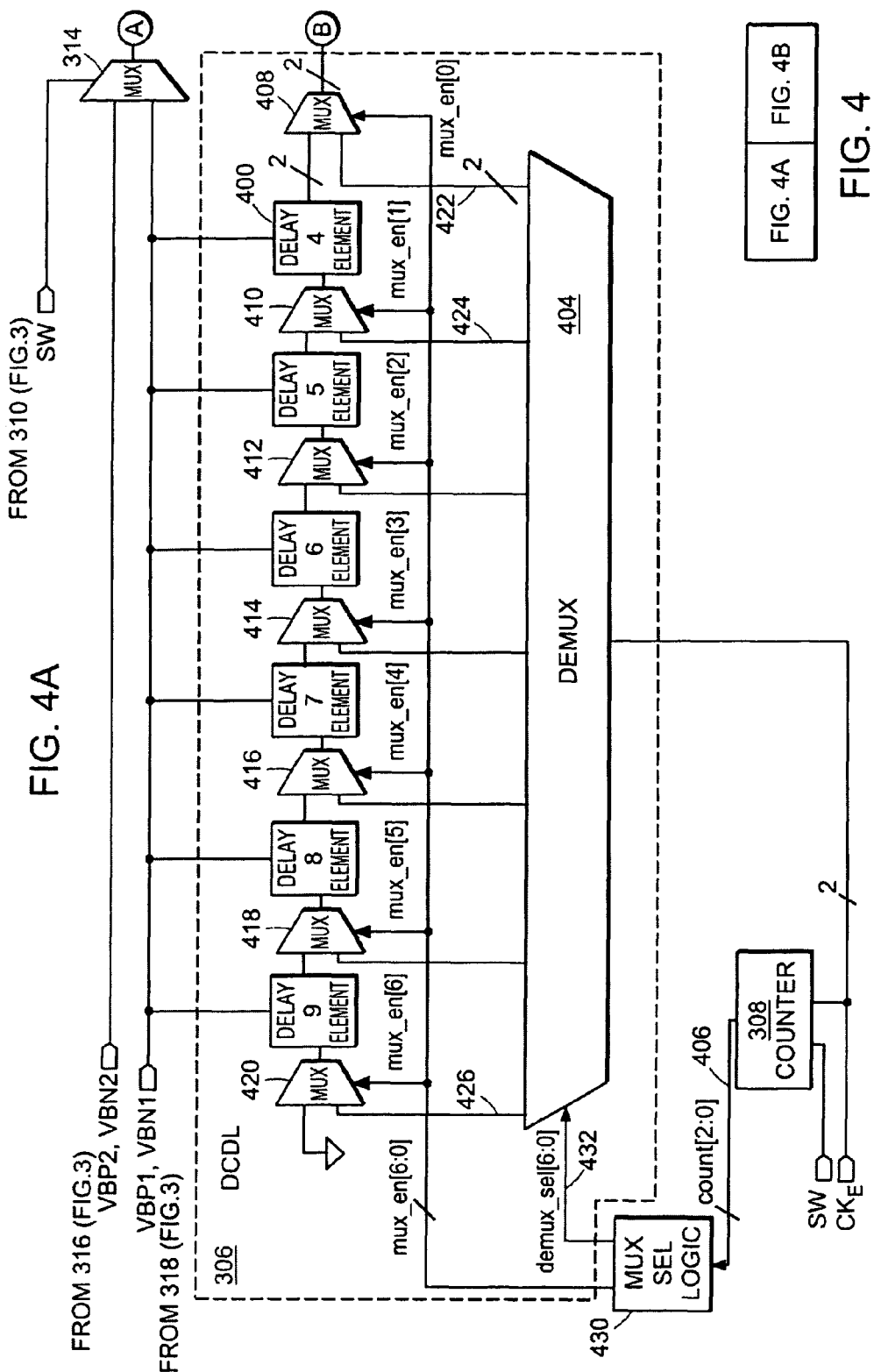
FIG. 4 illustrates delay cells in the DCDL and the VCDL.
Figure 4B:
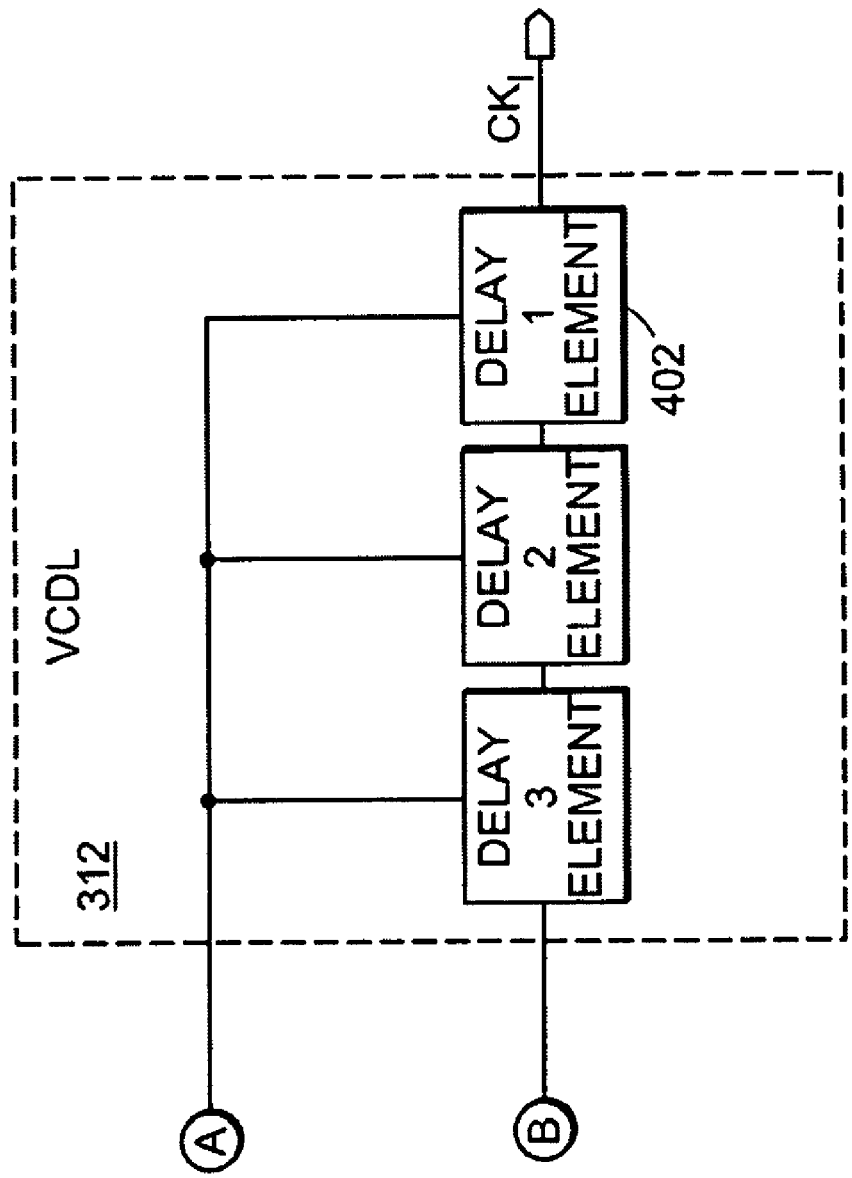

FIG. 4 illustrates delay cells in the DCDL and the VCDL The digitally controlled delay line (DCDL) includes a chain of DCDL delay cells 400 and the voltage controlled delay line (VCDL) includes a chain of VCDL delay cells 402. The delay of each DCDL cell 400 is fixed by permanently connecting the bias voltage for each DCDL cell 400 to a fixed bias voltage $V_{BP1}, V_{BN1}$. The fixed bias voltage $V_{BP1}, V_{BN1}$ is provided by a bias voltage generator 318 (FIG. 3) which can be any type of voltage stabilizing device, for example, a band-gap reference and need not correspond to the VCDL bias voltage 322 initially applied to the VCDL At initialization, none of the delay elements 400 in the DCDL 306 are engaged. The DLL delay includes only the fixed delay provided by demultiplexor 404, multiplexor 408 and the VCDL delay elements 402 in the VCDL connected to the fixed bias voltage $V_{BP1}, V_{BN1}$. The VCDL delay provided by VCDL is dependent on the fixed bias voltage $V_{BP1}, V_{BN1}$. In the embodiment shown, the DCDL delay cells 400 and the VCDL delay cells 402 are the same delay cell with voltage controlled delay. However, in an alternate embodiment, the DCDL delay cell 400 can differ from the VCDL delay cell 402.

The DCDL is initially variable by increasing the number of DCDL delay elements 400 with each DCDL delay element 400 having the same delay fixed by the fixed bias voltage $V_{BP1}, V_{BN1}$. In the embodiment shown, during initialization the same fixed bias voltage $V_{BP1}, V_{BN1}$ is coupled to the DCDL delay elements 400 and the VCDL elements 402. However, in alternate embodiments, the fixed bias voltage coupled to the VCDL delay elements 402 and the DCDL delay elements 400 can be different; for example, a first bias voltage may be set to $0.7V_{DD}$ coupled to the DCDL and a second bias voltage may be set to $0.5V_{DD}$ coupled to the VCDL. The VCDL delay is initially fixed with each of the three VCDL delay elements 402 numbered 1-3 coupled to the fixed bias voltage $V_{BP1}, V_{BN1}$, but the VCDL delay varies with changes in the VCDL bias voltage 322 during normal operation.

The number of engaged elements in the DCDL 306 is dependent on the n-bit count 406 output by the counter 308. The n-bit count 406 is coupled to the de-multiplexor 404 to select the output of the de-multiplexor 404 through which the external clock is output to the DCDL 306. The n-bit count 406 is also coupled to multiplexor select logic 430 which provides an m-bit multiplexor select signal, with one of the m-bits coupled to each multiplexor in the DCDL 306. In one embodiment the multiplexor select logic 430 is a decoder which decodes the n-bit count to provide the m-bit multiplexor select signal. In the embodiment shown m is 7 and n is 3. There are with six delay elements 400 labeled 4-9. The multiplexor select logic 430 decodes a three bit count 406 to select one of the seven multiplexors through which to forward the external clock as shown in Table 1 below. The Most Significant Bit (MSB) of the seven bit multiplexor select signal corresponds to the select signal for multiplexor 420 and the Least Significant Bit (LSB) of the seven bit multiplexor signal corresponds to the select signal for multiplexor 408. Thus, as the count increases the number of delay elements engaged increases. In an alternate embodiment, the multiplexor select logic can be implemented as a shift register clocked by the external clock and enabled by the SW signal.

TABLE 1

| Count count [2:0] | Multiplexor select mux_en [6:0] | De-multiplexor select demux_sel [6:0] |
|---|---|---|
| 000 | 1111110 | 1111110 |
| 001 | 1111101 | 1111101 |
| 010 | 1111011 | 1111011 |
| 011 | 1110111 | 1110111 |
| 100 | 1101111 | 1101111 |
| 101 | 1011111 | 1011111 |
| 110 | 0111111 | 0111111 |

After lock has been reached, the external clock signal $CK_E$ is delayed through DCDL delay elements engaged dependent on the n-bit count output by counter 308. Control of the DLL delay is switched to the VCDL 312 by switching the bias voltage $V_{BP1}, V_{BN1}$ to the bias voltage $V_{BP2}, V_{BN2}$ through the multiplexor 314 (FIG. 3).

Thus, the DLL delay includes minimum delay provided by the engaged DCDL delay elements 400 in the DCDL 306 and additional delay provided by the VCDL 312 to provide an accurate DLL delay. The stability of the DLL is increased by using the digital domain to cover a wide delay range to obtain a minimum delay, then freezing the digital domain to allow the analog domain to operate within a small delay range to control the DLL delay. The bias voltage coupled to the VCDL bias voltage 322 is set so that the VCDL does not control the DLL delay until after lock is detected by the digital domain. Before lock, the VCDL merely provides a constant delay independent of the phase difference between the clocks.

Initially the counter 308 is reset to 0. The de-multiplexor 404 directs the external clock $CLK_E$ to engage delay elements dependent on the n-bit count 406 output by the counter 308. With count 406 set to '0', $CLK_E$ is directed through output 422 of de-multiplexor 404 coupled to multiplexor 408 and no delay DCDL elements 400 are engaged.

After the counter 308 is incremented to '1' by $CLK_E$, $CLK_E$ is directed through output 424 of the de-multiplexor 404 by count 406 set to '1' to engage DCDL delay stage labeled 4. Multiplexor 410 is enabled to allow $CLK_E$ through to DCDL delay stage 400 labeled 4 and the m-bit multiplexor select signal output by multiplexor select logic 430 allows delayed $CLK_E$ through multiplexor 408 to the VCDL.

All six DCDL delay stages are engaged when the count 406 is six, and $CLK_E$ is directed through de-multiplexor output 426 through multiplexors 420, 418, 416, 414, 412, 410, 408 and delay elements labeled 9-4. The DCDL line is frozen when the counter 308 is disabled by the SW signal.

Figure 5:
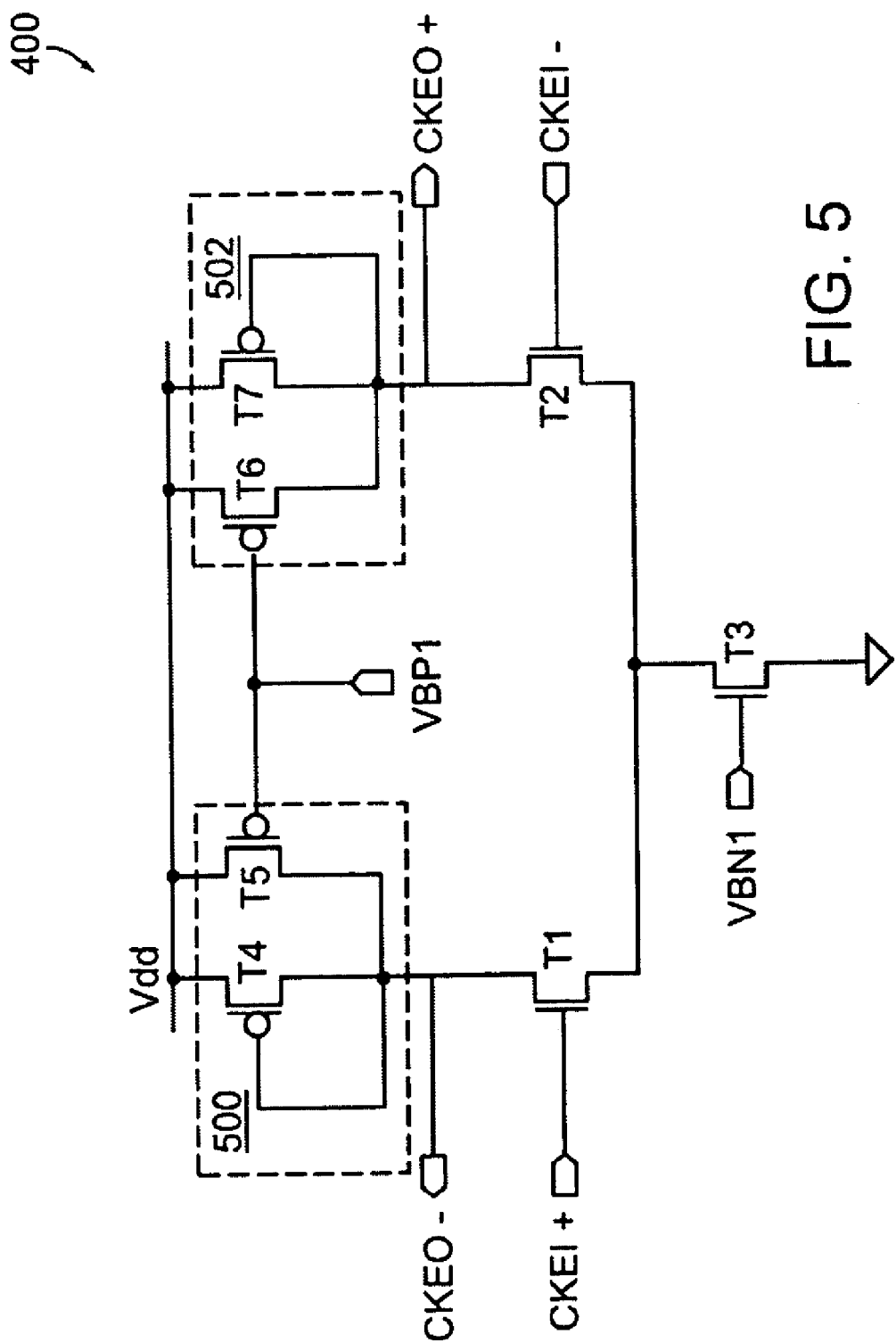
FIG. 5 is a schematic of one embodiment of any one of the delay cells shown in FIG. 4.

FIG. 5 is a schematic of one embodiment of any one of the delay elements shown in FIG. 4. The delay cell 400 includes a source-coupled pair of NMOS devices T1, T2 with symmetric loads 500, 502.

The differential input clock signal $CLK_EI-$, $CLK_EI+$, is coupled to the respective gates of NMOS devices T1, T2 with $CLK_EI+$ coupled to the gate of NMOS device T1 and $CLK_EI-$ coupled to the gate of NMOS device T2. The differential output clock signal $CLK_EO-$, $CLK_EO+$, is coupled to the respective drains of NMOS devices T1, T2. The sources of NMOS devices T1 and T2 are coupled and are also coupled to the drain of NMOS current source T3. NMOS current source T3 compensates for drain and substrate voltage variations.

Symmetric load 500 includes a diode-connected PMOS device T4 connected in parallel with a biased PMOS device T5. Symmetric load 502 includes a diode-connected PMOS device T7 connected in parallel with a biased PMOS device T6. The effective resistance of the symmetric loads 500, 502 changes with changes in the bias voltage $V_{BP1}$ resulting in a corresponding change in delay through the delay stage from the differential clock input to the differential clock output.

Figure 1:
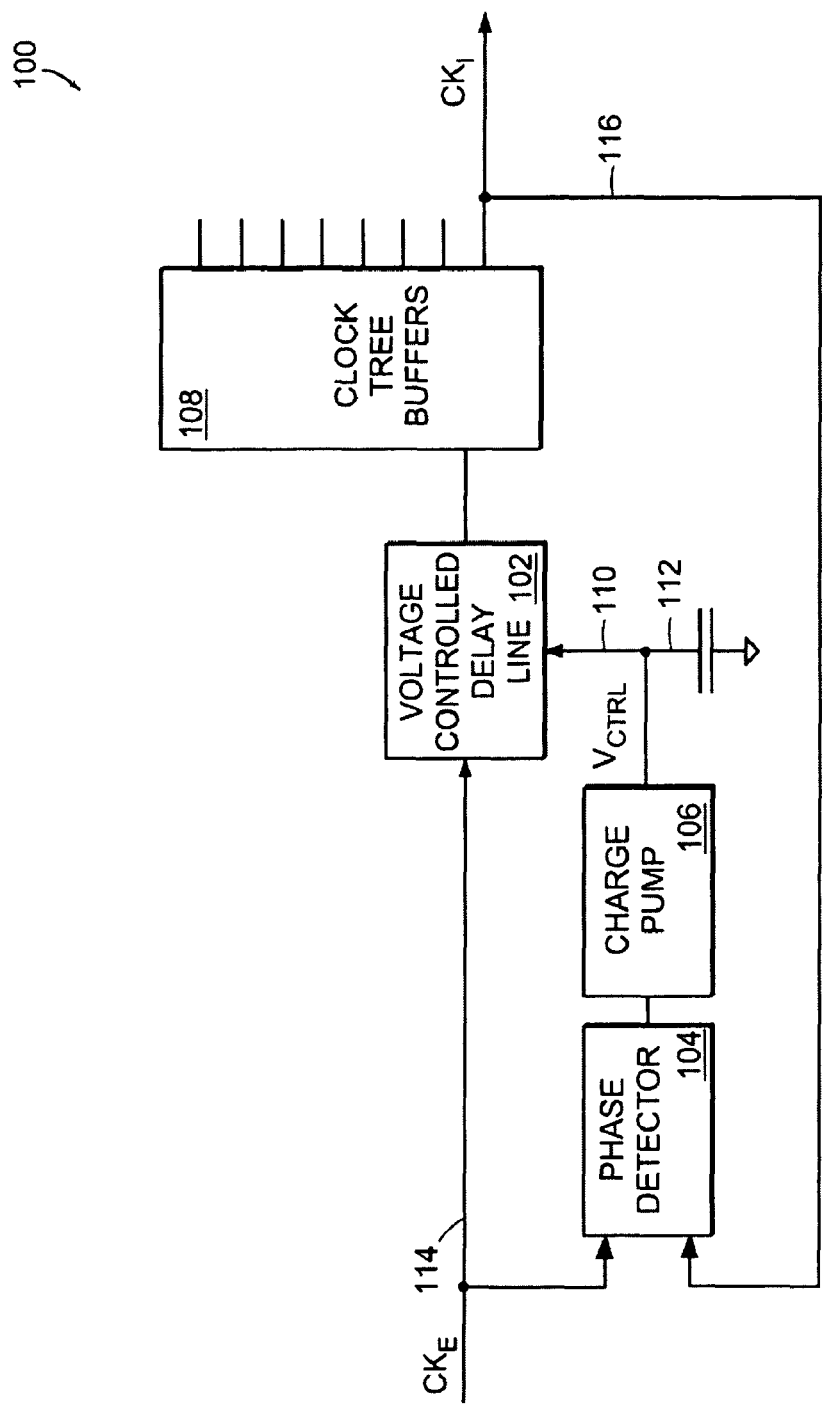
FIG. 1 is a block diagram of a prior art analog delay locked loop (DLL)
Figure 2:
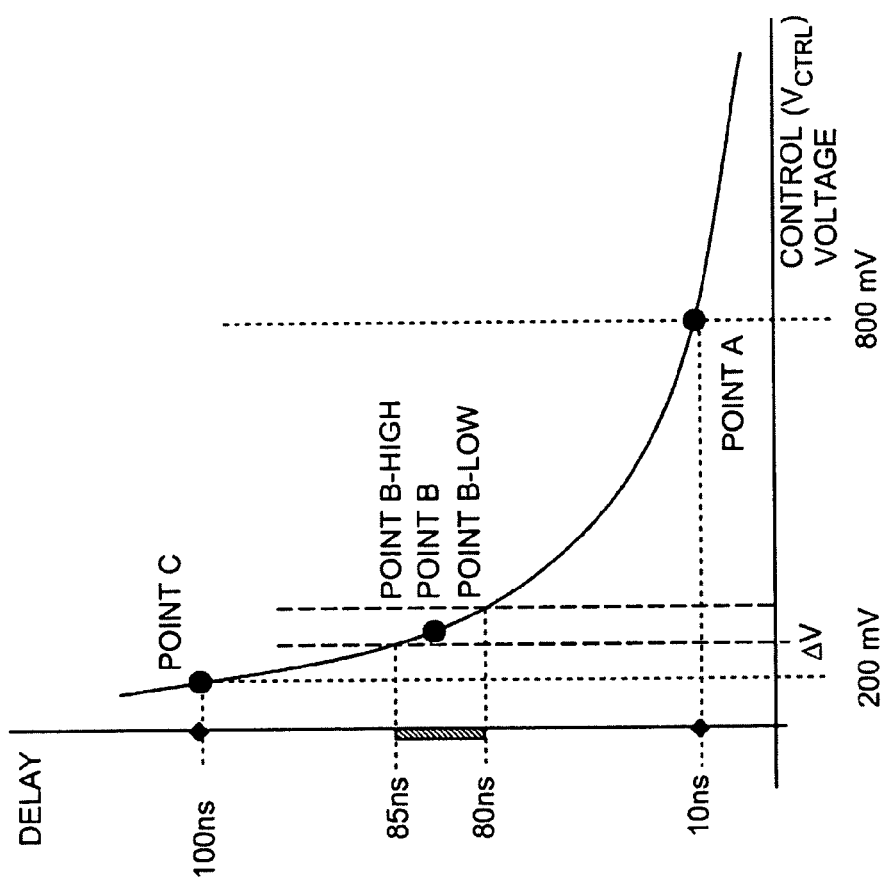
FIG. 2 is a graph illustrating the non-linear controlling voltage characteristic for the voltage controlled delay line shown in FIG. 1.
Figure 6:
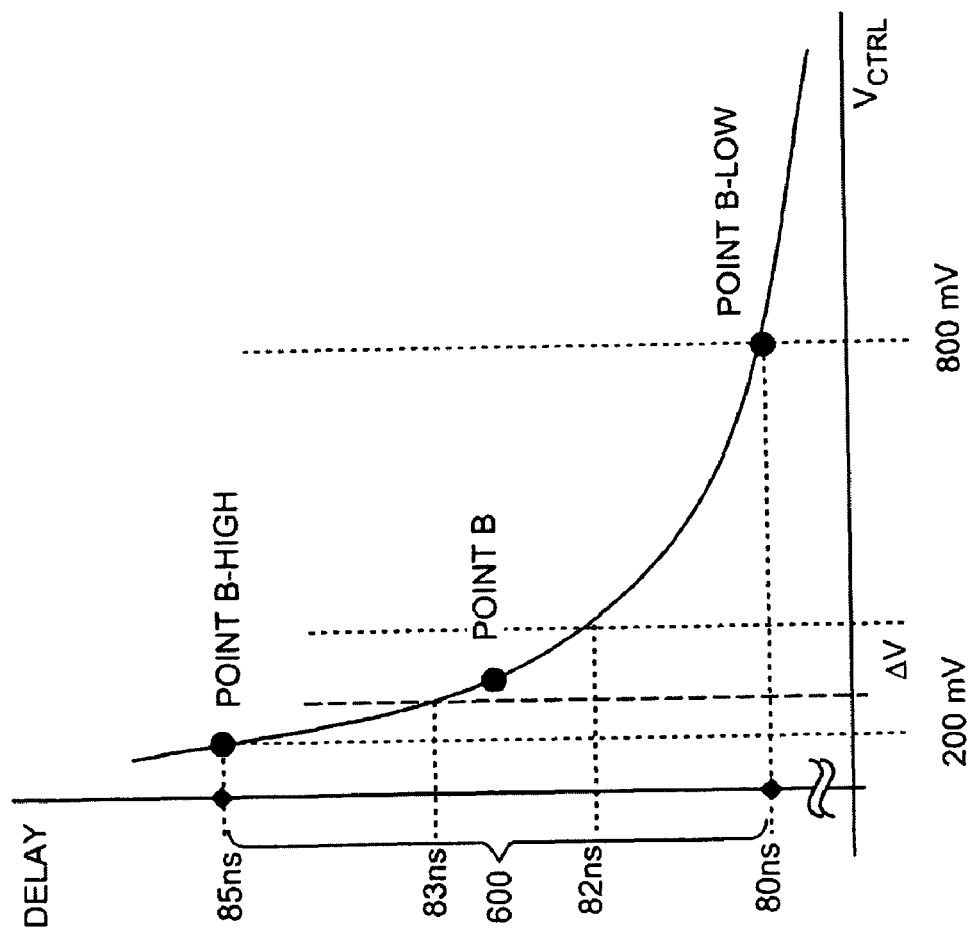
FIG. 6 is a graph illustrating the non-linear controlling voltage characteristic for the narrow frequency range of the VCDL in the DLL shown in FIG. 3.

FIG. 6 is a graph illustrating the non-linear control voltage characteristic for the narrow delay range of the VCDL 312 in the DLL 300 shown in FIG. 3. In the embodiment shown, the digital domain provides the minimum delay to bring the operating range of the DLL 300 to point B. After lock, the analog domain operates within a narrow delay range 600 from point B-High to point B-Low. This delay range is much smaller than the wide delay range supported by the DLL, but may be controlled by the same large voltage range as applied in the pure analog case of FIG. 2. The small delay range controlled by a large voltage range ensures the stability of the analog domain during normal operation of the DLL.

As shown, the analog delay circuit 304 operates within the delay range 85 ns to 80 ns over voltage range 200 mV to 800 mV. In contrast to the wide delay range over the same voltage range shown in FIG. 2, a small variation in control voltage ($\Delta V$) does not substantially affect the delay.

Figure 7:
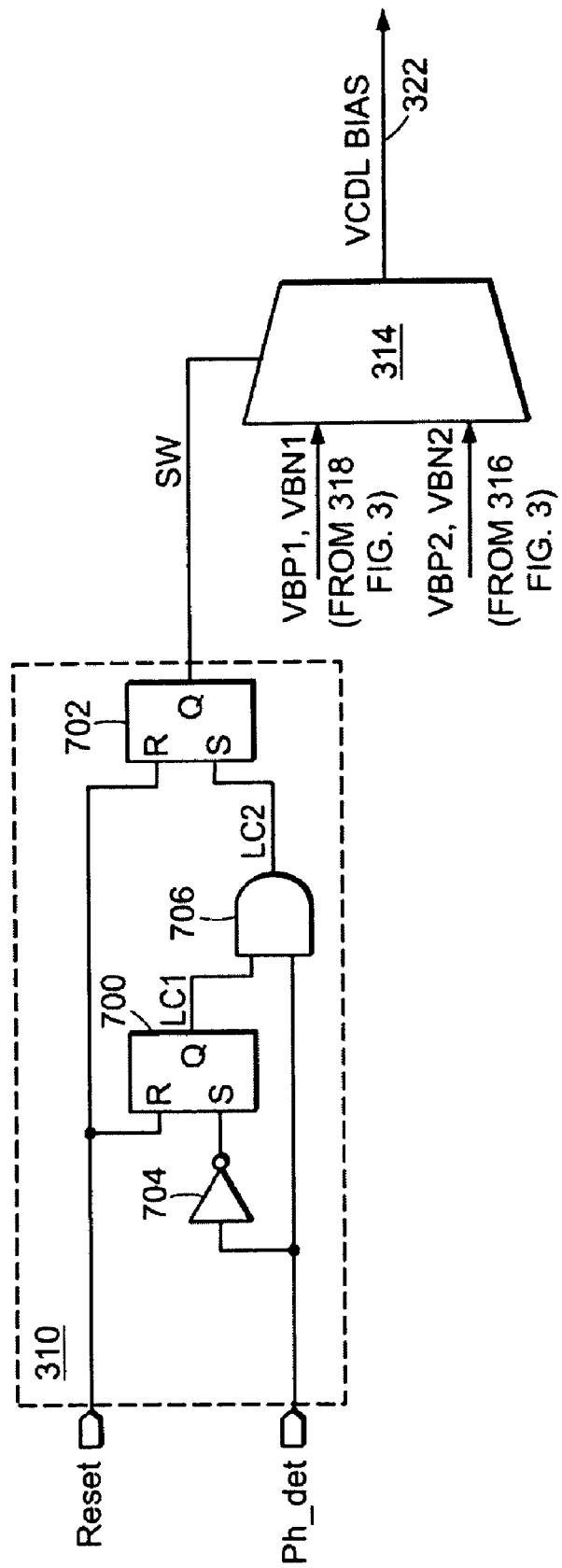
FIG. 7 is a schematic of an embodiment of the lock detector and the analog switch shown in FIG. 3.

FIG. 7 is a schematic of an embodiment of the lock detector 310 and the multiplexor 314 shown in FIG. 3. The lock detector 310 includes two SR flip-flops 700, 702, AND gate 706 and inverter 704. SR flip-flop 700 detects when the internal clock signal $CK_1$ is within a phase detection window. SR flip-flop 702 detects when the internal clock signal $CK_1$ is in phase with the external clock signal $CK_E$. Once the internal clock signal $CK_1$ is in phase with the external clock signal $CK_E$ the SW signal is set to logic '0' to disable further changes to the DCDL delay.

The lock detector output SW is set to logic 'x0' prior to lock being reached and set to logic 'x1' after lock is reached. Prior to lock being reached, the logic '0' on the SW signal couples the fixed bias voltage through multiplexor 314 to provide the VCDL bias voltage 322. After lock has been reached, the logic '1' on SW couples the variable bias voltage $V_{BPN2}$, $V_{BPN2}$ through multiplexor 314 to provide the VCDL bias voltage 322, to allow the VCDL 312 to fine tune the overall delay.

On power up, the reset signal coupled to the R-input of the SR flip-flop 700 and the SR flip-flop 702 is set to logic '1'. Both flip-flops 700, 702 are reset with the respective Q outputs (LC1, SW) set to logic '0'. The SR flip-flops 700, 702 remain in a reset state with logic '0' on the respective Q outputs until the phase detector 320 detects that the phase difference between clock signals $CK_E$, $CK_1$ are in the phase detection window. The phase difference is within the phase detection window while the rising edge of the internal clock signal $CK_1$ is after the falling edge of the external clock signal $CK_E$. The output of the phase detector (Ph_det) changes to logic '0'. The logic '0' on Ph_det changes the S-input of SR flip flop 700 to logic '1' through inverter 704 which sets SR flip-flop 700 (i.e. the Q output changes to logic '1'). The delay provided by the DCDL 306 continues to increase further delaying the rising edge of the internal clock signal until the internal clock signal and the external clock signals are in phase. SR flip-flop 702 is set on the next rising edge of Ph-det which occurs when the rising edge of $CK_E$ is detected after the rising edge of $CK_1$. The Q output of SR flip-flop 702 is set to logic '1'. The logic '1' on the output of SR flip-flop 702, the SW signal, disconnects the VCDL bias signal 322 from bias voltage $V_{BP1}$, $V_{BN1}$ through multiplexor 314 and connects the bias signal $V_{BP2}$, $V_{BN2}$ from charge pump 316 (FIG. 3) to the VCDL bias signal 322 to the VCDL 312.

The lock detector 310 remains in a locked state with SW set to logic '1' until the system is reset. While in the locked state, the digital domain no longer controls the delay because, while SW is set to logic '1', the code stored in the counter 308 is frozen to freeze the DCDL delay.

Figure 8:
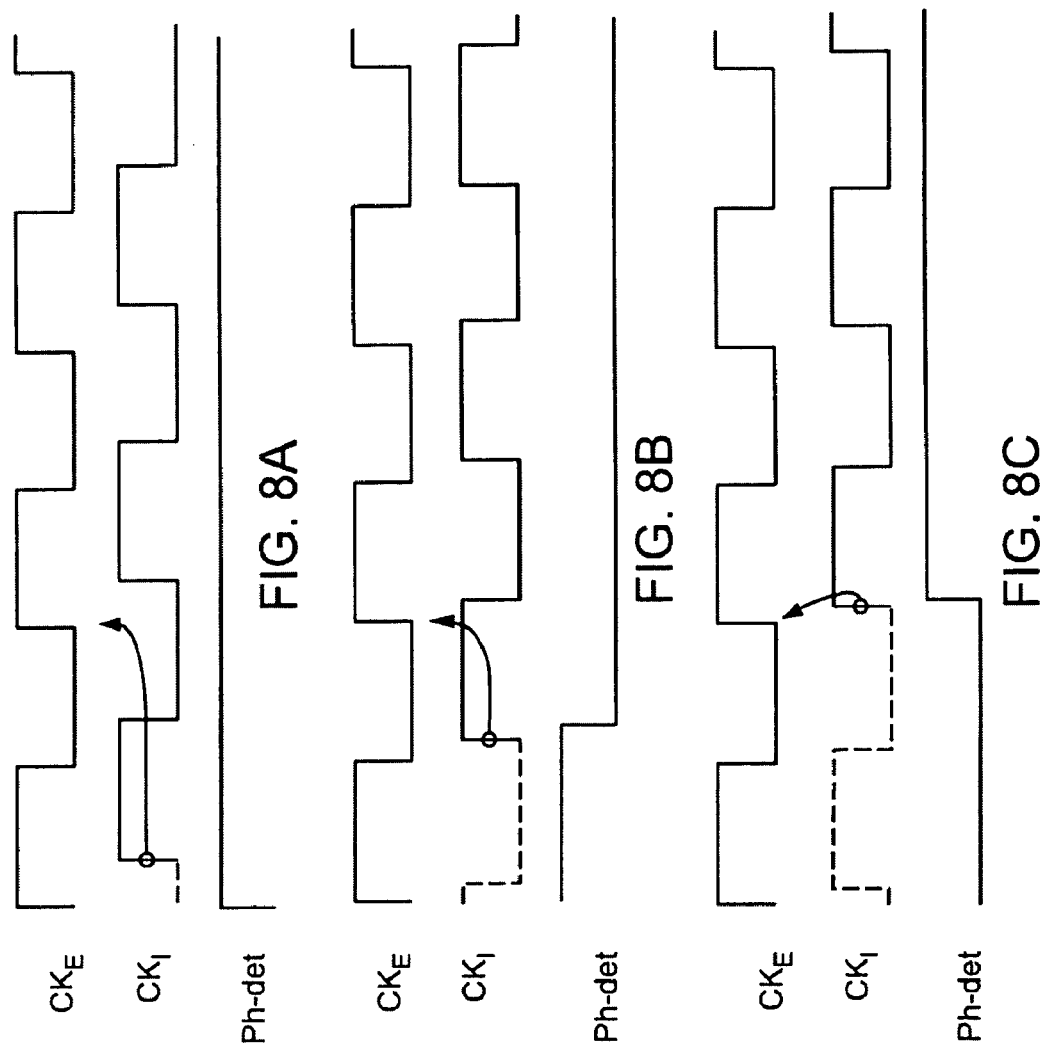
FIGS. 8A-C are timing diagrams illustrating the relationship of the phase detector output to the phase difference between the clocks.

FIGS. 8A-C are timing diagrams illustrating the relationship of the phase detector output (Ph-det) to the phase difference between the clocks. Referring to FIG. 8A, at initialization, the phase detector 320 (FIG. 3) detects that the internal clock rising edge is after the external clock rising edge. The rising edge of $CK_1$ latches a '1' on the Ph_det output of the D-type flip-flop. The $CK_E$ rising edge continues to increment the code to add additional delay to the DCDL.

Referring to FIG. 8B, the phase detector detects that the $CK_1$ rising edge is now after the falling edge of $CK_E$. The rising edge of $CK_1$ latches a '0' on the Ph_det output of the D-type flip-flop. The $CK_E$ rising edge increments the code to add further delay cells to the DCDL.

Referring to FIG. 8C, the phase detector detects the lock condition when the $CK_1$ rising edge moves after the $CK_E$ rising edge. The rising edge of $CK_1$ latches a '1' on the Ph_det output of the D-type flip-flop.

Figure 9:
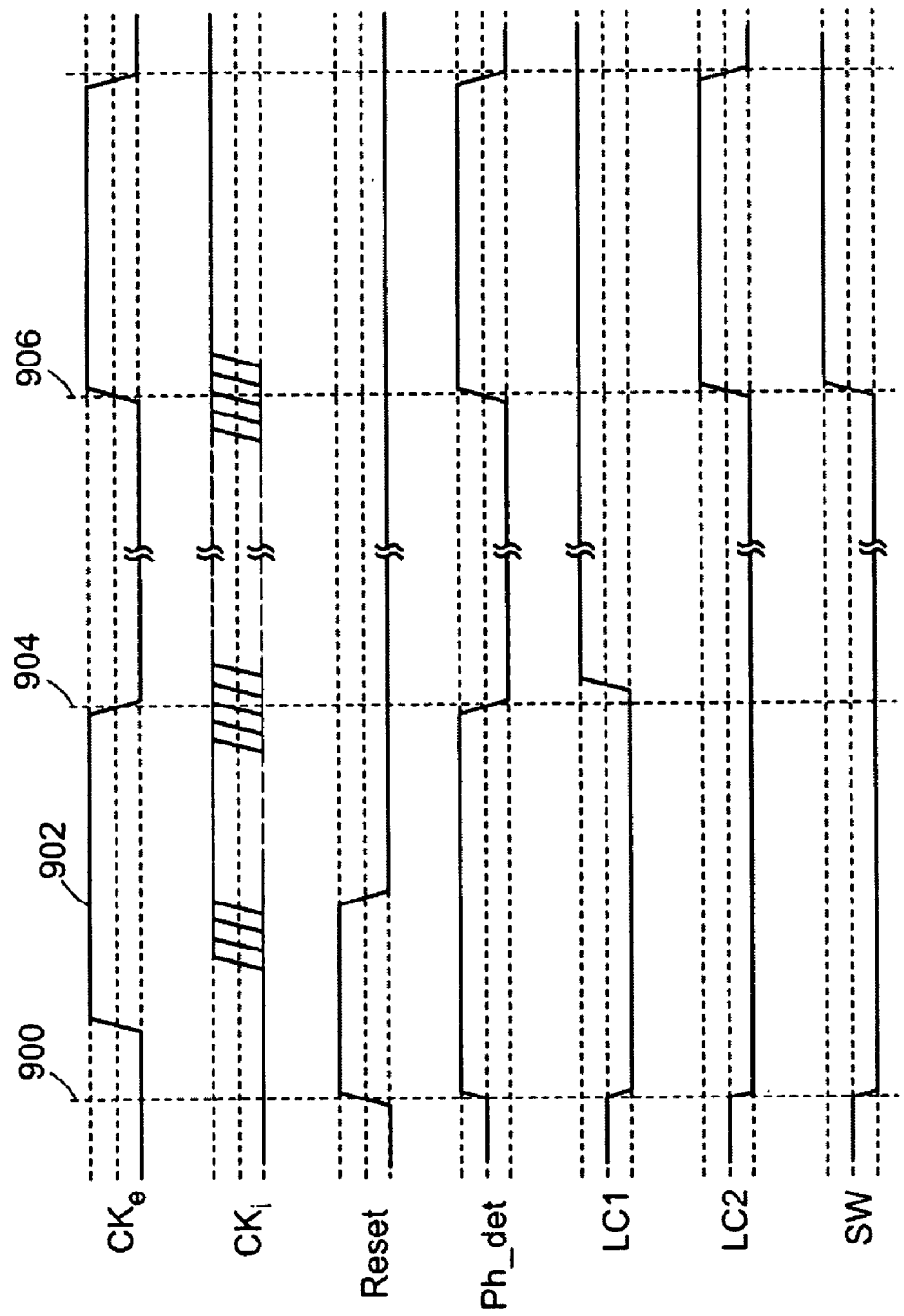
FIG. 9 is a timing diagram illustrating signals in the schematic shown in FIG. 7.

FIG. 9 is a timing diagram illustrating signals in the schematic shown in FIG. 7. The timing diagram shows the state of signals in the schematic when the system is reset, upon detecting that the phase detection window has been reached and upon detecting lock. FIG. 9 is described in conjunction with FIG. 3 and FIG. 7.

At time 900, the system is reset and the reset signal set to logic '1'. The reset signal is coupled to the R-inputs of flip-flops 700, 702 to reset the flip-flops. The Ph_det signal is reset to logic '1'. The Q outputs (LC1, SW) of both flip-flops are reset to '0'. The internal clock signal $CK_1$ has the same frequency as the external clock signal $CK_E$ but there is an initial phase difference due to the delay of $CK_E$ through the clock tree buffers 328.

At time 802, after the system is reset, the reset signal changes to logic '0'. Initially delay is added to $CK_E$ through the VCDL and no delay is added through the DCDL. The rising edge of $CK_1$ occurs later than the rising edge of $CK_E$ due to the delay through the clock tree buffers 328 (FIG. 3) and the delay through the VCDL. The SW signal set to logic '0' allows $CK_E$ to increment the code stored in the counter 308 (FIG. 3). As the code stored in the counter 308 (FIG. 3) is incremented by $CK_E$ (rising edge or falling edge), more delay elements 400 (FIG. 4) are added to the DCDL 306 (FIG. 3) to further delay $CK_E$. The delay between $CK_E$ and $CK_1$ increases until the phase detection window is reached.

At time 904, the phase detector 320 (FIG. 3) detects that the phase detection window has been reached. The Ph_det signal output from the phase detector changes state from logic '1' to logic '0' indicating that the phase detector 320 has detected a rising edge of $CK_1$ signal after a falling edge of $CK_E$. SR flip-flop 600 is set, and LC1 at the Q output is set to '1'. In successive clock periods, the phase difference between $Ck_E$ and $Ck_1$ decreases as the DCDL delay is increased.

At time 906, the phase detector 320 (FIG. 3) detects that the minimum DCDL delay has been added by the DCDL; that is the rising edge of $CK_1$ occurred after the rising edge of $CK_E$. The Ph-det output of the phase detector 320 changes to logic '1'. LC2 at the output of AND gate 706 changes to logic '1', the SR flip-flop 702 is set and the Q output (SW) changes to logic '1'. Further changes on the Ph-det signal do not affect the state of LC1 and SW. The SW signal set to '1' disables further incrementing of the counter 308.

During normal DLL operation, the delay adjustment of the clock path to compensate for drifts and condition changes covers a narrow range of the wide delay range. Thus, after the lock has been reached, the DCDL provides the minimum delay. The DLL delay is varied by the VCDL inside a smaller delay range. Monitoring the smaller delay range during normal operation provides more stability and reduces the controlling voltage node sensitivity.

The invention has been described for an embodiment having a single fixed bias voltage level. In an alternate embodiment, more than one fixed bias voltage level can be used to provide a more compact DLL that is less noise sensitive. This allows the wide delay range to be modified in order to reduce the number of DCDL delay elements by selecting a fixed bias voltage level dependent on the frequency of the external clock. Reducing the number of DCDL delay elements, reduces sensitivity to noise. For example, in one embodiment, with a fixed bias voltage of $0.6V_{DD}$, fifteen DCDL delay elements are required to provide the DCDL delay. When the fixed bias voltage is $0.7V_{DD}$, only eight DCDL delay elements are required to provide the DCDL delay. However, changing the delay range may result in the delay range covering an unstable region, for example, at point C in the graph shown in FIG. 2.

The invention can be used in integrated circuits requiring high accuracy of input/output data synchronization, for example, in memory integrated circuits.

While this invention has been particularly shown and described with references to preferred embodiments thereof, it will be understood by those skilled in the art that various changes in form and details may be made therein without departing from the scope of the invention encompassed by the appended claims. For example, while the delay of the DCDL remains fixed over short times, it may be allowed to occasionally shift as, for example, the VCDL approaches its delay limits.

What is claimed is:

1. A delay locked loop for synchronizing an internal clock signal with an external clock signal, the delay locked loop comprising:
   a digital delay line circuit including a counter and a lock detector;
   an analog delay line circuit;
   a phase detector to detect a phase difference between the external clock signal and the internal clock signal;
   the counter being set to an initial value corresponding to an initial delay;
   a first detection circuit providing a first condition signal in response to first criteria being met, the first criteria based on first relative edge occurrences with respect to the internal and external clock signals;
   a second detection circuit providing a second condition signal in response to second criteria being met, the second criteria based on second relative edge occurrences with respect to the internal and external clock signals;
   the lock detector allowing the digital delay line circuit to increase delay by adding delay elements as the counter increases from the initial value, and in response to the lock detector circuit detecting that the first and second condition signals are present, the analog delay line circuit subsequently adjusting the delay locked loop; and
   an alignment between edges of the external clock signal and the internal clock signal disabling further incrementing of the counter to hold the digital delay line circuit at a fixed delay to permit adjustment of the delay locked loop by the analog delay line circuit.

2. The delay locked loop of claim 1, wherein the counter is initially set to zero.

3. The delay locked loop of claim 1, wherein the counter is an up counter.

4. The delay locked loop of claim 1, wherein the counter is enabled by a signal from the lock detector.

5. The delay locked loop of claim 3, wherein the up counter increments in response to each rising edge of the external clock signal.

6. The delay locked loop of claim 1, wherein the number of delay elements depends on a count output by the counter.

7. The delay locked loop of claim 1, wherein the external clock signal is delayed by a number of delay elements in the digital delay line circuit, the number of delay elements depends on a count output by the counter.

8. The delay locked loop of claim 1, wherein the counter is implemented as a ripple counter.

9. The delay locked loop of claim 1, wherein the digital delay line circuit includes a bias voltage generator.

10. The delay locked loop of claim 1, wherein the analog delay line circuit includes a voltage controlled delay line circuit, a multiplexer, and a charge pump.

11. The delay locked loop of claim 10, wherein the multiplexer selects from at least two bias voltages to supply to the voltage controlled delay line circuit.

12. The delay locked loop of claim 11, wherein the voltage controlled delay line circuit includes a plurality of PMOS transistors.

13. An apparatus including a delay locked loop used to synchronize an internal clock signal with an external clock signal, the delay locked loop comprising:
   a digital delay line circuit including a counter, a lock detector, and a bias voltage generator;
   an analog delay line circuit including a voltage controlled delay line circuit, a multiplexer, and a charge pump;
   a phase detector to detect a phase difference between the external clock signal, and the internal clock signal;
   the multiplexer selecting from at least two bias voltages to supply to the voltage controlled delay line, one of the bias voltages being fixed and another of the bias voltages being variable;
   the lock detector allowing the digital delay line circuit to increase delay by adding delay elements as the counter increases from the initial value; and
   the lock detector comprising a circuit responsive to the internal clock signal when the internal clock signal satisfies a predetermined condition.

14. The apparatus of claim 13, wherein the lock detector comprises at least two flip flops and an inverter.

15. The apparatus of claim 14, wherein at least one flip flop detects when the internal clock signal is within a predetermined window.

16. The apparatus of claim 15, wherein at least a second flip flop detects when the internal clock signal is in phase with the external clock signal.

17. The apparatus of claim 16, wherein when the second flip flop detects that the internal clock signal is in phase with the external clock signal, the lock detector controls the counter to adjust delay using the analog delay line circuit.

18. The apparatus of claim 13, wherein the circuit device is one of a microprocessor, or a synchronous dynamic random access memory.

19. A method of controlling delay comprising:
   detecting an internal clock signal derived from an output of a delay circuit, the internal clock signal comprising successive clock edges of first and second logic level transitions, the first logic level transition being opposite of the second logic level transition;
   detecting an external clock signal prior to a locked condition, the external clock signal comprising successive clock edges of first and second logic level transitions, the first logic level transition being opposite of the second logic level transition;

detecting that a clock edge of the first logic level transition of the internal clock signal occurs after a clock edge of the first logic level transition of the external clock signal and before a clock edge of the second logic level transition of the external clock signal, and maintaining an initialization signal to increment delay of the delay circuit in an unlocked condition;

subsequently detecting that a clock edge of the first logic level transition of the internal clock signal is after a clock edge of the second logic level transition of the external clock signal; and providing a signal that the clock edge of the first logic level transition of the internal clock signal is within a phase detection window while continuing to increment delay of the delay circuit.

20. The method of claim 19, further comprising subsequently detecting that a clock edge of the first logic level transition of the internal clock signal is at about a clock edge of the first logic level transition of the external clock signal, and disabling changes to delay of the delay circuit.

21. The method of claim 20 wherein the delay circuit is a digital delay circuit, the method further comprising enabling changes to delay in an analog delay circuit in series with the digital delay circuit when changes to delay of the digital delay circuit are disabled.

22. The method of claim 20 wherein the delay circuit is a digital delay circuit and delay is incremented by incrementing number of delay elements that are enabled.

23. A method for performing phase adjustment in a delay locked loop comprising:

setting a counter to an at least substantially minimum value corresponding to an initial delay;

incrementing the counter from the at least substantially minimum value;

enabling delay elements in a digital delay circuit as the counter is incremented to provide coarse phase adjustment in the delay locked loop, the enabled delay elements corresponding to a counter value;

detecting an alignment between edges of an output clock signal and an input clock signal;

in response to the alignment, disabling the course phase adjustment and providing fine phase adjustment with an analog delay circuit; and holding the analog delay circuit at a fixed delay until the digital delay circuit completes the coarse phase adjustment.

24. The method of claim 23, wherein the digital delay circuit operates in a wide delay range.

25. The method of claim 24, wherein the analog delay circuit operates in a small delay range within the wide delay range.

26. The method of claim 23, further comprising providing a delay in the digital delay circuit using a plurality of fixed delay elements.

27. The method of claim 23, further comprising freezing the counter upon detecting the alignment.

28. The method of claim 23, wherein incrementing the counter only increases a value of the counter from the minimum value.

29. The method of claim 28, wherein enabling the delay elements only increases delay of the digital delay circuit.

30. The method of claim 23, wherein the at least substantially minimum value is a minimum value.

31. The method of claim 23, wherein the counter is an up counter.

32. The method of claim 23, wherein the counter increments in response to rising edges of the input clock signal.

33. The method of claim 23, wherein a maximum count of the counter corresponds to a sum total of the delay elements.

34. The method of claim 23, wherein the counter is implemented as a ripple counter.

* * * * *

UNITED STATES PATENT AND TRADEMARK OFFICE
CERTIFICATE OF CORRECTION

| | | |
|---|---|---|
| PATENT NO. | : 8,000,430 B2 | |
| APPLICATION NO. | : 11/999162 | |
| DATED | : August 16, 2011 | |
| INVENTOR(S) | : Peter Vlasenko et al. | |

It is certified that error appears in the above-identified patent and that said Letters Patent is hereby corrected as shown below:

In Column 12, Claim 23, line 5 delete "course" and insert --coarse--

Signed and Sealed this
Twenty-seventh Day of November, 2012

David J. Kappos
*Director of the United States Patent and Trademark Office*